United States Patent
Gordon et al.

(10) Patent No.: US 7,414,883 B2
(45) Date of Patent: Aug. 19, 2008

(54) PROGRAMMING A NORMALLY SINGLE PHASE CHALCOGENIDE MATERIAL FOR USE AS A MEMORY OR FPLA

(75) Inventors: George A. Gordon, San Jose, CA (US); Ward D. Parkinson, Boise, ID (US); John M. Peters, San Jose, CA (US); Tyler A. Lowrey, West Augusta, VA (US); Stanford Ovshinsky, Bloomfield Hills, MI (US); Guy C. Wicker, Southfield, MI (US); Ilya V. Karpov, Santa Clara, CA (US); Charles C. Kuo, Union City, CA (US)

(73) Assignee: Intel Corporation, Santa Clara, CA (US)

( * ) Notice: Subject to any disclaimer, the term of this patent is extended or adjusted under 35 U.S.C. 154(b) by 223 days.

(21) Appl. No.: 11/407,573

(22) Filed: Apr. 20, 2006

(65) Prior Publication Data
US 2007/0247899 A1    Oct. 25, 2007

(51) Int. Cl.
*G11C 11/00* (2006.01)
(52) U.S. Cl. ....................... 365/163; 365/174
(58) Field of Classification Search ................. 365/163, 365/174; 257/2, 3
See application file for complete search history.

(56) References Cited

U.S. PATENT DOCUMENTS

| | | | |
|---|---|---|---|
| 4,199,692 A | 4/1980 | Neale | |
| 5,534,712 A | 7/1996 | Ovshinsky et al. | |
| 2006/0092810 A1* | 5/2006 | Sakamoto | 369/94 |
| 2007/0249086 A1* | 10/2007 | Philipp et al. | 438/95 |

OTHER PUBLICATIONS

Troles et al., "Characterization of New Sulfur and Selenium-Based Glasses Containing Lead Iodide", Journal of Non-Crystalline Solids, North-Holland Physics Publishing, Amsterdam, NL, vol. 352, No. 3, Mar. 1, 2006, pp. 248-254.

Vazques et al., "Evaluation of the Glass Forming Ability of Some Alloys in the Sb-As-Se System by Differential Scanning Calorimetry", Journal of Alloys and Compounds, Elsevier Sequoia, Lausanne, CH, vol. 354, No. 1-2, May. 12, 2003, pp. 153-158.

International Search Report dated Mar. 29, 2007 from the PCT counterpart application.

* cited by examiner

*Primary Examiner*—Vu A Le
(74) *Attorney, Agent, or Firm*—Trop, Pruner & Hu, P.C.

(57) ABSTRACT

A memory may be implemented with a stable chalcogenide glass which is defined as a generally amorphous chalcogenide material that does not change to a generally crystalline phase when exposed to 200° C. for 30 minutes or less. Different states may be programmed by changing the threshold voltage of the material. The threshold voltage may be changed with pulses of different amplitude and/or different pulse fall times. Reading may be done using a reference level between the threshold voltages of the two different states. A separate access device is generally not needed.

32 Claims, 5 Drawing Sheets

PROGRAMMING A NORMALLY SINGLE PHASE CHALCOGENIDE MATERIAL FOR USE AS A MEMORY OR FPLA

BACKGROUND

This invention relates generally to memories using chalcogenide materials.

Chalcogenide materials have been used as semiconductor memories for a number of years. These memories may be traditionally referred to as phase change memories. They typically involve the change from an amorphous to a crystalline phase. Chalcogenide memories to date have used materials that are bi-stable in that they will change from a generally amorphous state to a generally crystalline state when exposed to 200° C. for 30 minutes or less, and back to amorphous state by application of 650° C. for brief time with a rapid quench.

One advantage of chalcogenide materials in semiconductor memory applications is that a relatively modest amount of heat may transition the devices between different detectable phases or states. This heat may be generated by applying a current or voltage to the chalcogenide material.

While phase change materials have many advantages, they may also have some disadvantages in some situations. For example, the "off" state leakage may be high. An ovonic threshold switch has been viewed as a single-state chalcogenide device, but with a high "off" state leakage. When combined in series with a two state chalcogenide material, a high "off" state leakage results and with a two state memory. However, the resulting two layer stack requires multiple depositions.

DETAILED DESCRIPTION

Figure 1:
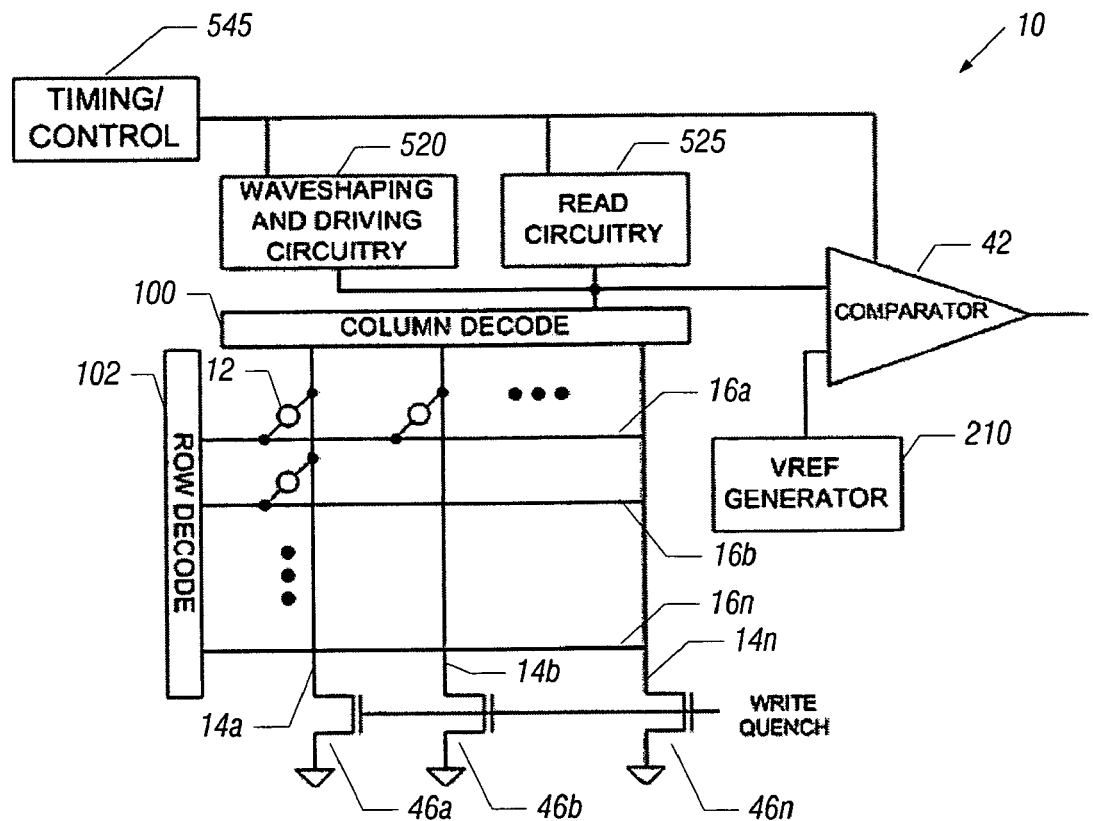
FIG. 1 is a schematic depiction of one embodiment of the present invention.

Referring to FIG. 1, an array of threshold-switch memory cells 12 may be formed along address lines 16a-16n which may be called row lines, coupled to a row decode circuit 102. The cells 12 may also be coupled to a column decode circuit 100 via address lines 14a-14n which may be called column lines.

Each cell 12 may include a stable chalcogenide material. In one embodiment, the chalcogenide material may be one which is generally in its amorphous phase and in operation does not change to a crystalline phase. More specifically, when exposed to 200° C. for thirty minutes or less, the chalcogenide material does not change phases, such as to a low resistance state. An Ovonic Unified Memory (OUM), such as $Ge_2Sb_2Te_5$ (GST), changes phase under these conditions.

A select or threshold device is an Ovonic Threshold Switch ("OTS") that can be made of an alloy of chalcogenide that does not switch from an amorphous to a crystalline phase and which undergoes a rapid, electric field initiated change in conductivity, a change in conductivity that persists only so long as a holding current through the device is present. Instead, through the application of appropriate programming pulses, the threshold voltage of the cell may be altered. These altered threshold voltage cells may then be detected as being in one or the other of at least two programmable states based on their threshold voltage. For added memory margin, a threshold-switch memory cell may be combined in series with an "OUM" (Ovonic Unified Memory) device or other alloy which changes phases from a low resistance to a high resistance phase and has a corresponding threshold difference between those phases.

A waveshaping and driving circuit 520 may supply pulses to the column decode circuit 100 for programming the cells 12. A read circuit 525 may apply column potentials or currents which may be used to detect the programming state of the cells 12. A write quench transistor 46a-46n may be positioned on each of the address lines 14a-14n.

Figure 6:
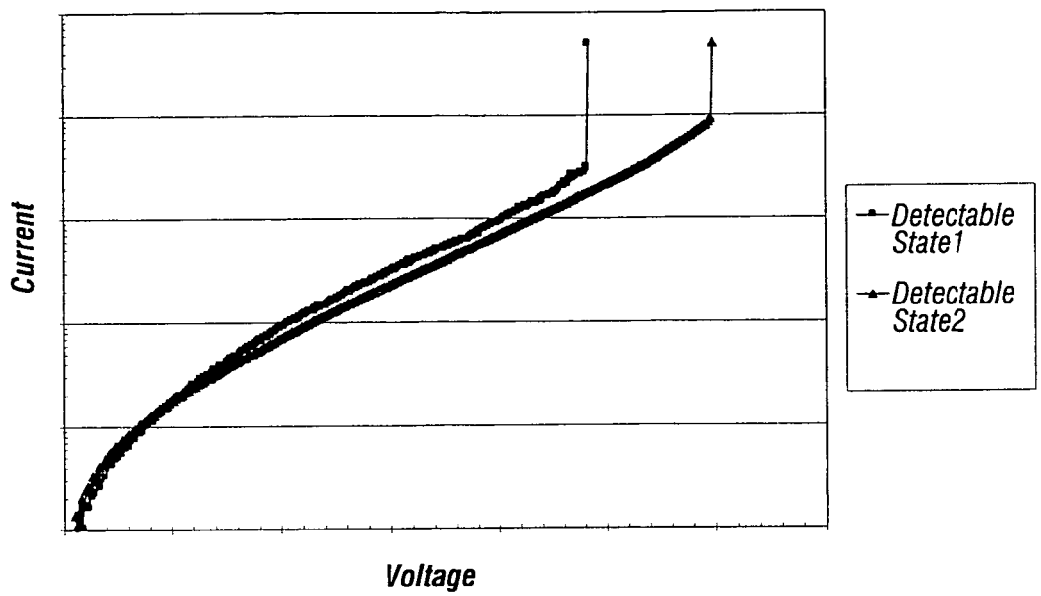
FIG. 6 is a current voltage plot for one embodiment of the present invention.
Figure 7:
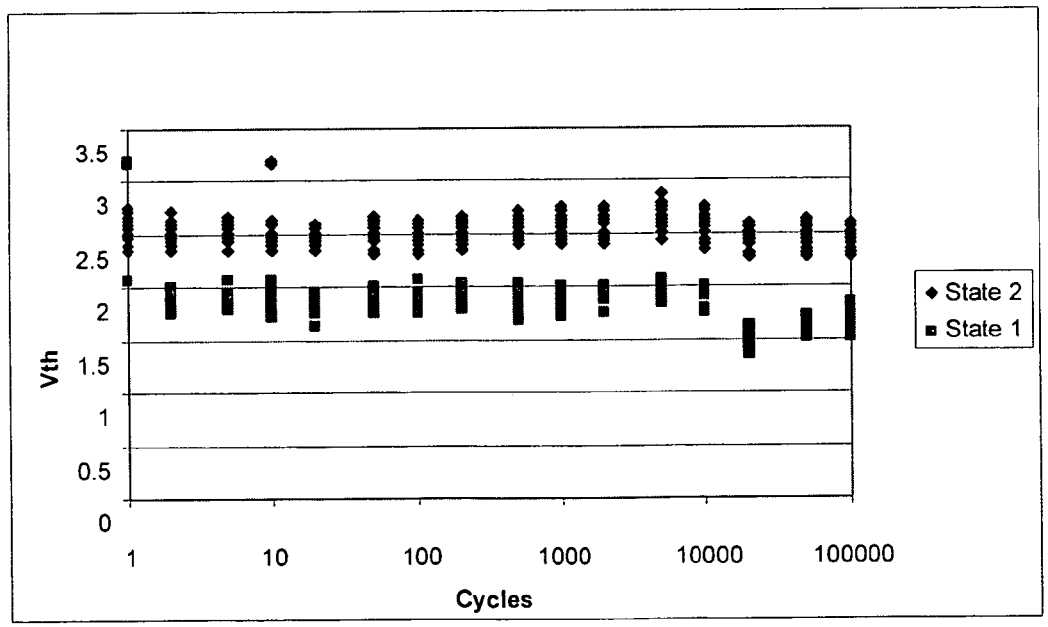
FIG. 7 is a graph of threshold voltage versus cycles for one embodiment.

In one embodiment, the address lines 14a-14n may be appropriately biased. Depending on the threshold voltage of the cells, the cells either conduct or do not conduct based on such a bias. For example, in one embodiment, a voltage bias which is midway between two states associated with different threshold voltages (for example, as shown in FIG. 6, detectable states 1 and 2) may be provided. These states may be maintained over a large number of cycles as indicated in FIG. 7.

The voltage that results at the node below the read circuit 525 for the selected column may be compared in a comparator 42 to a voltage generated by a reference generator 210. Again, in one embodiment, the reference generator 210 may generate a voltage which is midway between the two threshold voltages that may be assumed by the cell 12 selected by the row and column decoder, and depending on how they were previously programmed. Appropriate timing and control signals may be provided by the unit 545.

Figure 2:
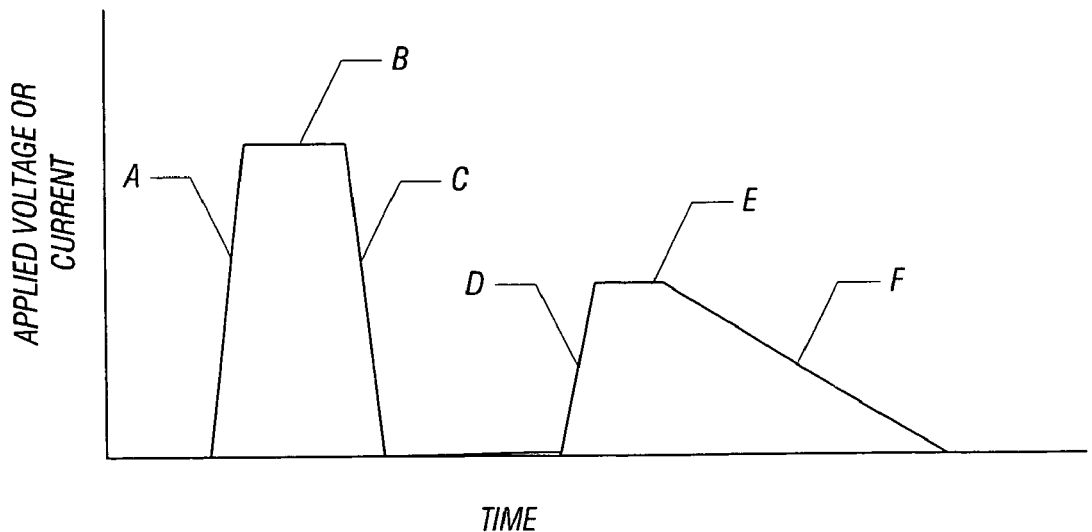
FIG. 2 is a graph of applied voltage or current versus time for programming pulses for programming a reset and set states in accordance with one embodiment of the present invention.

Referring to FIG. 2, in accordance with one embodiment of the present invention, a theoretical graph of applied voltage or current versus time is depicted. The reset programming pulse, having an amplitude B, may have a higher amplitude than the set programming pulse having an amplitude E. Moreover, the fall time C for a first detectable state pulse may be shorter than the fall time F for a second detectable state. These states correspond to different threshold voltages.

One method for programming between states on 300 A, 500 A, 750 A, and 1000 A thickness 3386 alloy OTS (36% Te, 31.75% As, 6% Ge, 26% Si, 0.25% In) is:

FIRST DETECTABLE STATE (respectively for A, B, C, in FIG. 2): Amplitude is approximately 700 uA; A=100 ns; B=1 us; C=10 ns (faster is better). Amplitude is preferably greater than 400 ua, depending on contact size and OTS alloy thickness, leading edge and pulse width are not critical and may be longer or shorter. Trailing edge may be slower but faster is better, hence the write quench transistor 46b on FIG. 1.

SECOND DETECTABLE STATE (for D,E,F): Amplitude is approximately 300 uA (<400 uA; >100 uA); D=1 us; E=2 us; F=15 us (longer is better). Amplitude is preferably between 100 ua and 400 uA for a contact area of approximately 1 $\mu m^2$. Leading edge and pulse width are not critical and may be longer or shorter. The trailing edge may be less, but is preferably longer for better margin.

Thus, the waveshaping and driving circuitry 520 may provide appropriate pulses to program the cells 12 to either of the detectable states. These pulses change the threshold voltage of the cells to either of the states. The pulse may be provided, for example, by p-channel current mirrors where the amplitude and edge rates are regulated, such as on-chip by bandgap regulators. The slow trailing edge may be created by an exponential turn-off or a stair-step down (by sequentially turning off 1 of N parallel current sources, where N is preferably 20 or greater).

Figure 3A:
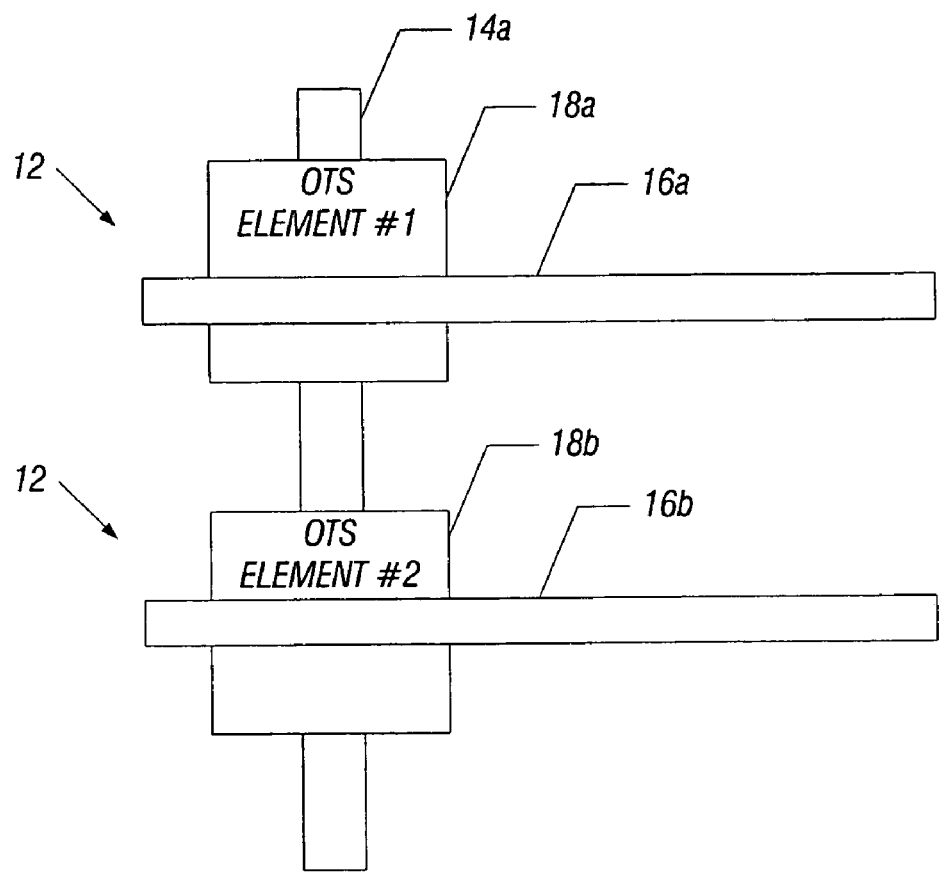
FIG. 3A is a circuit schematic showing a cell structure for one embodiment of the present invention.

Turning to FIG. 3A, in accordance with one embodiment of the present invention, each cell 12 may be made up of a first element 12a and a second element 12b. Each element is sandwiched between an address line, such as the column line 14a, and a pair of address lines, such as the row lines 16a and 16b. In such case, the elements 12a and 12b may be complementary such that if the element is in the second state, the other element is in the first state.

When a read current is applied to a selected column line, a row line is selected to 0 volts (FIG. 4), then a sense amplifier or comparator 42 detects a lower voltage on the second state element 12a or 12b in comparison to the first state element 12b or 12a. A zero results if the element is at a higher voltage than the element 2. A one results otherwise. Alternatively, a single element 12a may be selected and a reference voltage applied to comparator 42 in FIG. 1.

During a write operation, a bit can be written separately using a fast (C) or slow (F) trailing edge for bits written to a higher and lower threshold voltage detectable states. The bits in each memory unit may be always written to opposite states in one embodiment. During a write, the bias on the selected bit line may be reduced in comparison to the unselected bit lines.

Suitable chalcogenide materials for the elements 12 include the Ovonic Threshold Switch alloys that show device threshold voltage can be modified between at least two distinct states. Suitable alloys for use in some embodiments of the present invention include the following: 36 percent tellurium, 31.75 percent arsenic, 6 percent germanium, 26 percent silicon, and 0.25 percent indium; 39 percent tellurium, 36 percent arsenic, 9 percent germanium, 14 percent silicon, and 1 percent sulfur; 21 percent tellurium, 50 percent selenium, 10 percent arsenic, 2 percent antimony, and 2 percent sulfur; 45 percent tellurium, 30 percent arsenic, and 25 percent germanium; 42 percent selenium, 28 percent arsenic, and 30 percent germanium; or 30 percent tellurium, 15 percent selenium, 30 percent arsenic, and 25 percent germanium.

Useful alloys may include germanium (about 0-30%), tellurium (about 0-60%), arsenic (about 11-40%), selenium (about 0-42%) and antimony (about 5-15%). Such devices may have better stability when exposed to a longer second state pulse.

As an example, for a 0.5 micrometer diameter device 12 formed of TeAsGeSSe having respective atomic percents of 16/13/15/1/55, the holding current may be on the order of 0.1 to 1 micro-amps (uA) in one embodiment. Below this holding current, the device 12 turns off and returns to the high resistance regime at low voltage, low field applied. The threshold current for the device 12 may generally be of the same order as the holding current. The holding current may be altered by changing process variables, such as the top and bottom electrode material and the chalcogenide material, and/or the contact area between the electrodes and chalcogenide. The device 12 may provide high "on current" for a given area of device, such as compared to conventional access devices such as metal oxide semiconductor field effect transistors or bipolar junction transistors or semiconductor diodes.

By varying the shape of the second state pulse (D, E, and F in FIG. 2), the threshold voltage can be successfully reduced to levels that provide a clear distinction between second and first state pulses. Over time, the threshold voltage may drift and, eventually, second state threshold voltages may look like first state threshold voltages as initially defined.

Various techniques may be utilized to overcome drift. One is to have the complementary states as described and shown in connection with FIG. 3. Another approach is to program an entire block at one time and program a reference second and first state devices. Still another approach is to issue a triggering read pulse that effectively resets the Vth. One possible pulse is one of low current amplitude such as less than 100 uA that is too slow to transition the memory cell to the first state, but too fast to transition the cell 12 to the second state. Such a programming pulse may be non-disturbing to either state.

This memory cell may be used as a single layer between two interconnect lines, such as in a programmable logic array (PLA) or field programmable logic array (FPLA). Depending on the state of the layer, the element may be in a low or high resistance state across the lines. Upon powering up the logic, the power supply may be raised to be between the programmable thresholds. If greater than the lower threshold state of element 12a, the element triggers to low resistance at a lower holding voltage. If the power supply is less than the higher threshold state, the element 12a remains un-thresholded. Then, the power supply can be lowered or at least kept less than the higher threshold state, for normal operation.

By keeping the power supply voltage between the lower threshold and the higher threshold of a double threshold cell 12, an effective memory element usable for FPLA may be achieved. That is, when the power supply potential exceeds a cell programmed to a lower threshold voltage, the cell is triggered on, connecting the interconnect across the chalcogenide material. For chalcogenide material programmed to the higher threshold voltage, the power supply does not exceed the threshold voltage during a read operation and, therefore, an effective open circuit is achieved.

In some embodiments, because no additional select or threshold device is needed, a more economical memory may be achieved. Such memory may be implemented as a discrete memory, embedded memory, cross point, field programmable logic array, or field programmable gate array, to mention a few examples.

As a further alternative for a field programmable gate array, the gate of a transistor with source and drain connected respectively to the couplable logic interconnect, may be driven by the junction of a double-threshold cell 12 connected to ground and placed in series with a transistor source/drain to the supply voltage, either the logic supply or a separate or pumped power supply. Here, the cell 12 may be driven and programmed by this transistor in series with the power supply, and then the transistor may be biased at a low current as a low current pull up during normal logic operation at lower operating power supply. The threshold-switch and transistor pair may be reversed in order. The junction of the transistor drain and the cell 12 can drive the gate of a transistor with source/drain connected to the x, y couplable logic lines. Then, the transients from transitions of the couplable interconnect lines are passed through the cell 12. Here again, with the normal operating power supply set at least briefly on power up above the lower threshold state, and then either kept there or lowered, will result in the correct state drive to the gate of the transistor coupled across the logic lines.

Figure 3B:
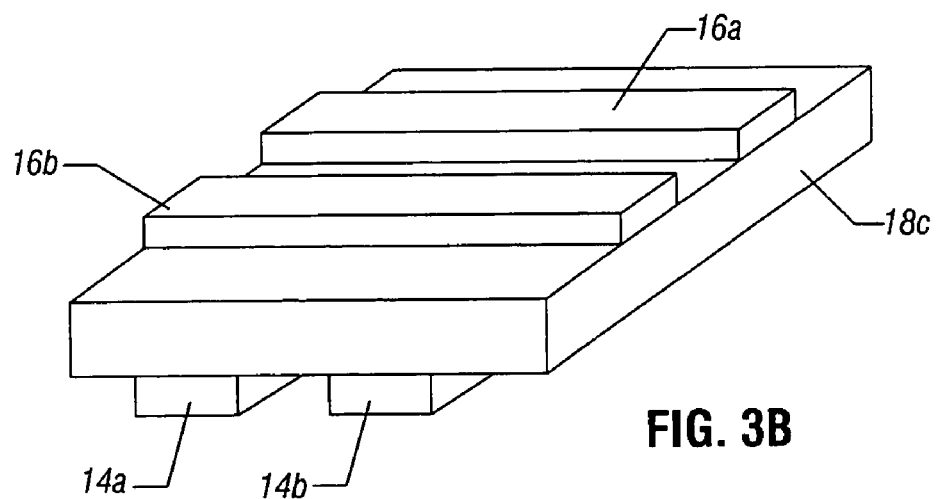
FIG. 3B is a circuit schematic showing a cell structure for another embodiment of the present invention.

Referring to FIG. 3B, in accordance with another embodiment of the present invention, a chalcogenide material 18c is maintained between a plurality of parallel conductive lines 16, 16b, and a plurality of transverse conductive lines 14a, 14b. The chalcogenide material 12 may be the same material as material 18a and 18b used in the embodiment of FIG. 3A. The conductive lines 16a in FIG. 3B may correspond to the conductive lines 16a in the embodiment of FIG. 3A, while the conductive lines 14a in FIG. 3B can correspond to the conductive line 14a in FIG. 3A. One difference is that a unitary chalcogenide material 18c is used in the embodiment of FIG. 3B and separate lines 14a are used to define each cell in each row and column.

Figure 4:
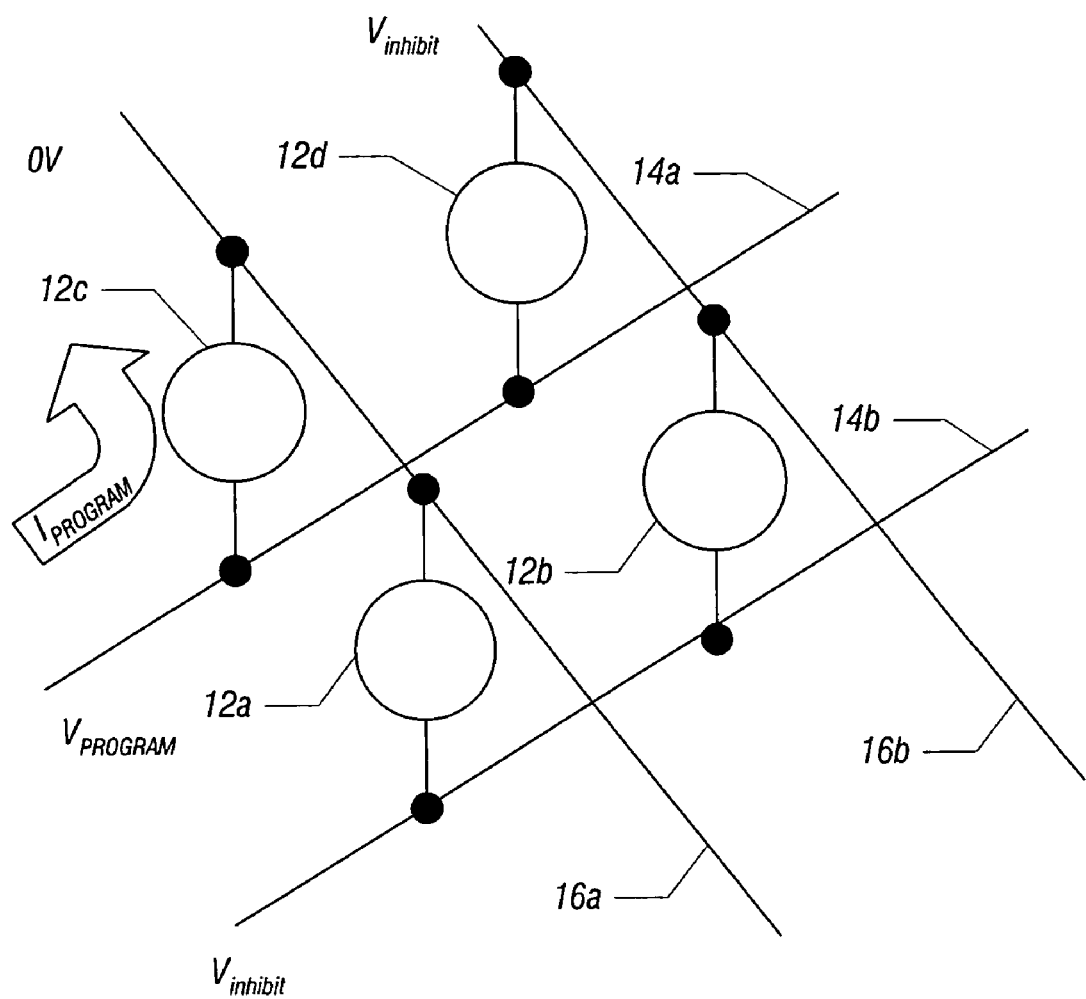
FIG. 4 is the depiction of a memory array in the course of being programmed in accordance with one embodiment of the present invention.

Referring to FIG. 4, in accordance with some embodiments of the present invention, the programming of the cells 12a-12d, along, for example, the selected row lines 16a and transverse column lines 14a and 14b, may be accomplished using a programming voltage, $V_{program}$. This programming voltage is applied to the selected cell or cells to be programmed, 12a to 12n, having the program voltage on its column line 14 and zero volts on its row line, in accordance with one embodiment. Single or multiple column lines may be programmed to the selected bits either sequentially or in parallel, or one per cycle.

The deselected cells (not to be programmed) have an inhibit voltage, $V_{inhibit}$, on them. The inhibit voltage may be an intermediate voltage placed on deselected rows and columns to ensure that the deselected bits do not turn on. Voltage drops across these cells may be kept smaller than the threshold voltage of the lowest voltage state bit. This condition may be satisfied by adhering to the following formula:

Vcol(desel)−Vrow (select) and Vcol(sel)−Vrow(desel) is less than Vth(min); where $V_{th(min)}$ is the lower of the first (1) or second (2) state threshold voltage. As a result, the programming current ($I_{program}$) into a selected column is directed only through the selected bit, aside from leakage to the unselected rows. By making the deselected rows and columns equal and about halfway between the peak programming voltage and ground, the voltage drops across the deselected cells are zero and the off state leakage between deselected row and columns may be confined only to cells along the selected row and column. Other bits in the sub-array block have a zero voltage drop and do not conduct current.

Since the column voltages are defined, a second or a first state device may be distinguished (i.e., read) by differences in the selected word line voltage when a constant current ($I_{read}$) is sent through a cell. Selected bit lines may be high, while other columns are biased at midpoint of the read or write voltage, to prevent the deselected bits from turning on. As in programming, deselected rows and columns may be kept at the same voltage to confine off state leakage to bits along the selected word line and bitline. Thus, in some embodiments, the read current is less than or equal to the threshold current of a second state bit and less than or equal to the threshold current of a first state bit. In another embodiment, the read voltage is less than or equal to the threshold voltage of a second higher Vth state bit and greater than or equal to a lower threshold voltage of a first state bit.

Embodiments may also include multilevel memories by including more than two detectable states, with distinguishable threshold voltages.

Figure 5:
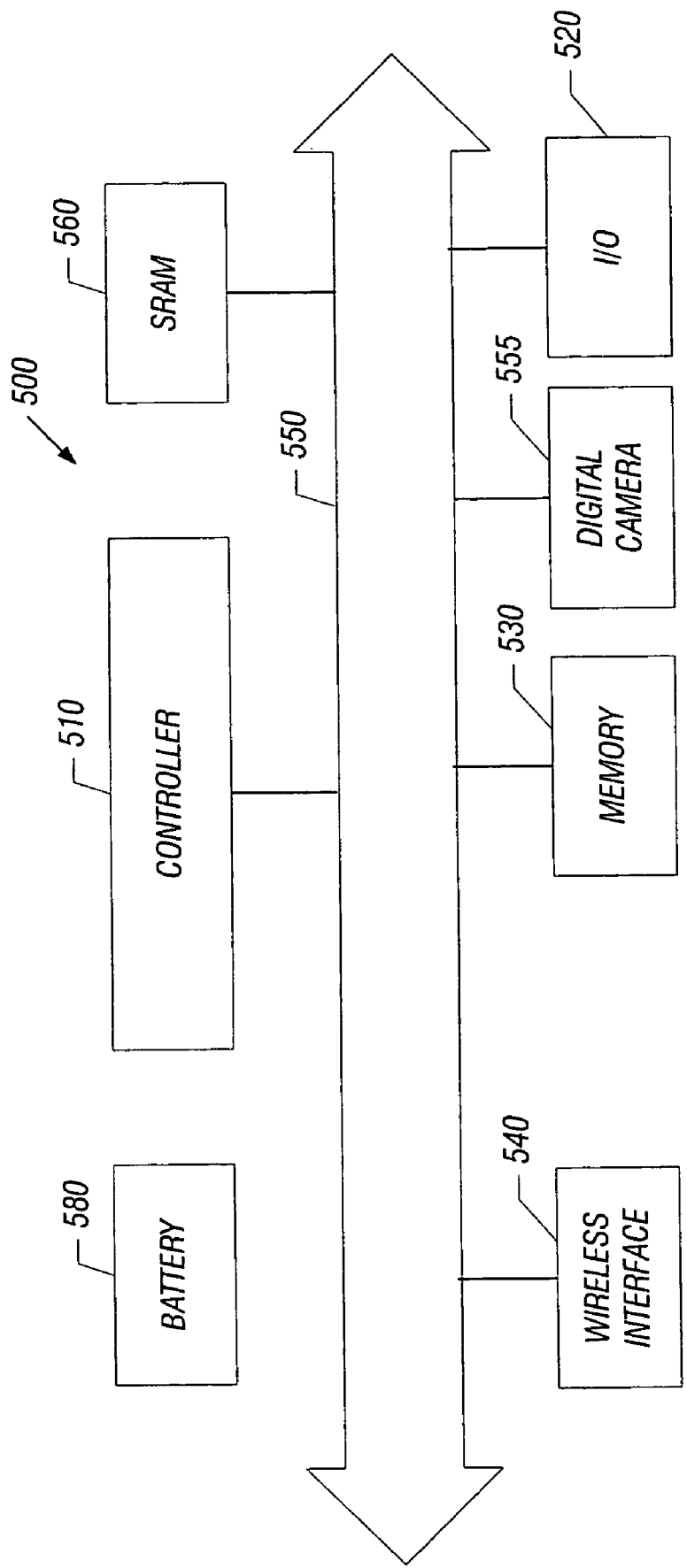
FIG. 5 is a system depiction in accordance with one embodiment of the present invention.

Turning to FIG. 5, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, or a cellular network, although the scope of the present invention is not limited in this respect.

System 500 may include a controller 510, an input/output (I/O) device 520 (e.g. a keypad, display), a memory 530, a wireless interface 540, a digital camera 555, and a static random access memory (SRAM) 560 and coupled to each other via a bus 550. A battery 580 may supply power to the system 500 in one embodiment. It should be noted that the scope of the present invention is not limited to embodiments having any or all of these components.

Controller 510 may comprise, for example, one or more microprocessors, digital signal processors, micro-controllers, or the like. Memory 530 may be used to store messages transmitted to or by system 500. Memory 530 may also optionally be used to store instructions that are executed by controller 510 during the operation of system 500, and may be used to store user data. The instructions may be stored as digital information and the user data, as disclosed herein, may be stored in one section of the memory as digital data and in another section as analog memory. As another example, a given section at one time may be labeled as such and store digital information, and then later may be relabeled and reconfigured to store analog information. Memory 530 may be provided by one or more different types of memory. For example, memory 530 may comprise a volatile memory (any type of random access memory), a non-volatile memory such as a flash memory, and/or memory 12 illustrated in FIG. 1. The logic on any of the blocks in FIG. 5 may utilize one or more embodiments herein to configure the logic and programmably interconnect the lines, as well as to create memory used to store data or programming instructions.

The I/O device 520 may be used to generate a message. The system 500 may use the wireless interface 540 to transmit and receive messages to and from a wireless communication network with a radio frequency (RF) signal. Examples of the wireless interface 540 may include an antenna, or a wireless transceiver, such as a dipole antenna, although the scope of the present invention is not limited in this respect. Also, the I/O device 520 may deliver a voltage reflecting what is stored as either a digital output (if digital information was stored), or it may be analog information (if analog information was stored).

While an example in a wireless application is provided above, embodiments of the present invention may also be used in non-wireless applications as well.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

programming a memory element, including a generally amorphous chalcogenide layer that does not change to a generally crystalline phase when exposed to 200° C. for thirty minutes or less, to have at least two different states with different threshold voltages.

2. The method of claim 1 including using an Ovonic Threshold Switch as a memory cell in said memory.

3. The method of claim 1 including providing a cell with two memory elements programmed to opposite states.

4. The method of claim 1 including providing a higher magnitude pulse to program one state than the other.

5. The method of claim 1 including providing a first pulse with a first fall time to program a first state and a second pulse with a second fall time different than said first fall time to program a second state.

6. The method of claim 1 including reading the state of a memory cell by applying a reference voltage between the threshold voltages of said states.

7. The method of claim 1 including using a reference level to determine the state of a cell.

8. The method of claim 1 including using a non-disturbing pulse to return the threshold voltage to near its initial state.

9. The method of claim 1 including biasing deselected cells of an array of memory elements with a voltage that is greater than the difference in threshold voltages of bits in first and second states but less than the threshold voltage of a bit in the second state.

10. A memory comprising:

at least two cells;

an address line coupled between said cells;

a programming circuit coupled to said cells;

a read circuit coupled to said cells; and wherein said cells have at least two detectable states, said states having different threshold voltages with the same phase, said cells including a generally amorphous chalcogenide material that does not change to a generally crystalline phase when exposed to 200° C. for thirty minutes or less.

11. The memory of claim 10 wherein said read circuit to apply a voltage between the threshold voltages of said states.

12. The memory of claim 10 wherein said programming circuit to apply pulses of different amplitude to program said different states.

13. The memory of claim 10 wherein said programming circuit to apply pulses with different fall times for said different states.

14. The memory of claim 10 wherein each cell includes two memory elements in different states.

15. The memory of claim 10 wherein said chalcogenide material does not change phase.

16. The memory of claim 10 wherein said chalcogenide includes 0 to 30% germanium, 0 to 60% tellurium, 11 to 40% arsenic, 0 to 42% selenium, and 5 to 15% antimony.

17. The memory of claim 10 including a common chalcogenide material for said cells.

18. The memory of claim 10 including a discrete chalcogenide material for each cell.

19. A system comprising:

a processor;

a dynamic random access memory coupled to said processor; and a chalcogenide memory including at least two cells, an address line coupled between said cells, a programming circuit coupled to said cells, a read circuit coupled to said cells, wherein cells have at least two detectable states, said states having different threshold voltages with generally the same phase, said cells including a generally amorphous chalcogenide material that does not change to a generally crystalline phase when exposed to 200° C. for thirty minutes or less.

20. The system of claim 19 wherein said read circuit to apply a voltage between the threshold voltages of said states.

21. The system of claim 19 wherein said programming circuit to apply pulses of different amplitude to program said different states.

22. The system of claim 19 wherein said programming circuit to apply pulses with different fall times for said different states.

23. The system of claim 19 wherein each cell includes two memory elements in different states.

24. The system of claim 19 wherein said chalcogenide material does not change phase.

25. The system of claim 19 wherein said chalcogenide memory includes an array having rows and columns, said address line being one of said rows or columns.

26. A memory comprising:

first and second conductors; and a generally amorphous chalcogenide material that does not change to a generally crystalline phase when exposed to 200° C. for 30 minutes or less between said conductors, said chalcogenide including less than about 30% germanium, less than about 60% tellurium, from about 10 to about 40% arsenic, less than about 40% selenium, and from about 5 to about 15% antimony.

27. The memory of claim 26 when said chalcogenide includes about 35% tellurium, 30% arsenic, and 5% germanium.

28. The memory of claim 26 wherein said chalcogenide includes about 40% tellurium, 35% arsenic, and 10% germanium.

29. The memory of claim 26 wherein said chalcogenide includes about 20% tellurium, 50% selenium, 10% arsenic, and 2% antimony.

30. The memory of claim 26 wherein said chalcogenide includes about 45% tellurium, 30% arsenic, and 25% germanium.

31. The memory of claim 26 wherein said chalcogenide includes about 40% selenium, 30% arsenic, and 30% germamum.

32. The memory of claim 26 wherein said chalcogenide includes about 30% tellurium, 15% selenium, 30% arsenic, and 25% germanium.

* * * * *